(12) United States Patent
Trucco

(10) Patent No.: US 6,229,124 B1
(45) Date of Patent: *May 8, 2001

(54) INDUCTIVE SELF-SOLDERING PRINTED CIRCUIT BOARD

(76) Inventor: Horacio Andrés Trucco, 25 Nursery Rd., Melville, NY (US) 11747-1048

(*) Notice: Subject to any disclaimer, the term of this patent is extended or adjusted under 35 U.S.C. 154(b) by 0 days.

This patent is subject to a terminal disclaimer.

(21) Appl. No.: 09/501,925

(22) Filed: Feb. 10, 2000

Related U.S. Application Data

(63) Continuation-in-part of application No. 09/396,923, filed on Sep. 14, 1999.
(60) Provisional application No. 60/103,848, filed on Oct. 10, 1998, and provisional application No. 60/125,846, filed on Mar. 24, 1999.

(51) Int. Cl.$^7$ ............................................. H05B 6/10

(52) U.S. Cl. .................... 219/605; 219/616; 219/650; 219/665; 228/180.1

(58) Field of Search ......................... 219/605, 616, 219/617, 603, 650, 647, 660, 663, 665, 666; 228/180.1; 29/860, 878; 438/128

(56) References Cited

U.S. PATENT DOCUMENTS

| | | | |
|---|---|---|---|
| 2,803,731 | * 8/1957 | Coburn | 219/616 |
| 4,300,031 | * 11/1981 | Reboux et al. | 219/617 |
| 4,431,891 | * 2/1984 | Forstner et al. | 219/616 |
| 4,845,332 | * 7/1989 | Jancosek et al. | 219/667 |
| 4,983,804 | * 1/1991 | Chan et al. | 219/616 |
| 5,747,779 | * 5/1998 | Asanasavest | 219/605 |

FOREIGN PATENT DOCUMENTS

| | | | |
|---|---|---|---|
| 1-84589 | * 3/1989 | (JP) | 219/675 |
| 8-293668 | * 11/1996 | (JP) | |
| 9-283916 | * 10/1997 | (JP) | |

* cited by examiner

*Primary Examiner*—Philip H. Leung

(57) ABSTRACT

A new apparatus for inductively soldering surface-mount, straddle-mount and through-hole type electronic components into a self-soldering PCB (printed circuit board) in an automated fashion utilizing localized Electromagnetic Induction Heating (E.I.H.). Current manufacture technology for packaging electronic components depends on the reflow and wave soldering processes. Both processes heat up to relatively high temperatures the entire assembly, namely its PCB and all the electronic components being soldered into it. Such harsh high-temperature environment frequently causes components damage resulting in rejects and/or demanding rework. With this invention reflow oven and/or wave soldering equipment is not required. During a soldering operation only the leads and pads being soldered are heated but neither the body of said electronic components nor the dielectric material forming said self-soldering PCB and its interconnecting traces are heated. Because of this selectively localized inductive heating, the invention permits to reduce cost and improve the quality and reliability of manufactured products. The invention consumes about 200 times less energy than the reflow and wave soldering processes. This invention can readily be utilized to complement and/or supplement the reflow and wave soldering processes by providing selective inductive self-soldering of odd-form and/or heat-sensitive components. The invention also allows in-process, and in-situ, testing of soldered joints quality thus permitting rework before final assembly of a self-soldering PCB is completed. This invention also provides for a useful inductive de-soldering apparatus.

10 Claims, 7 Drawing Sheets

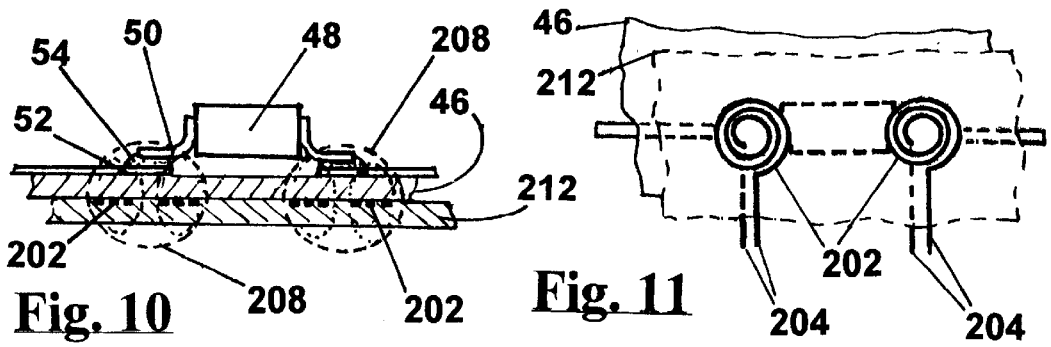
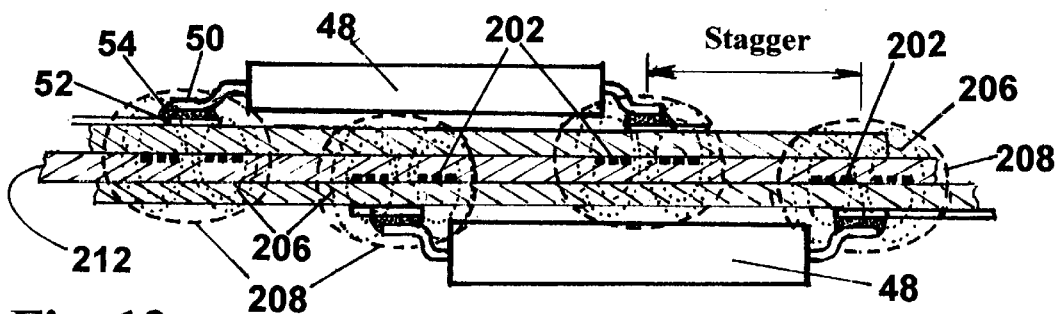
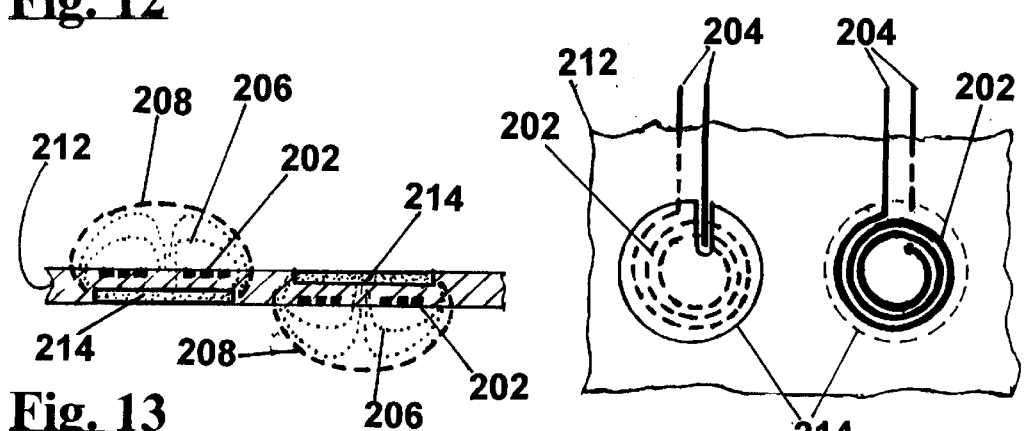
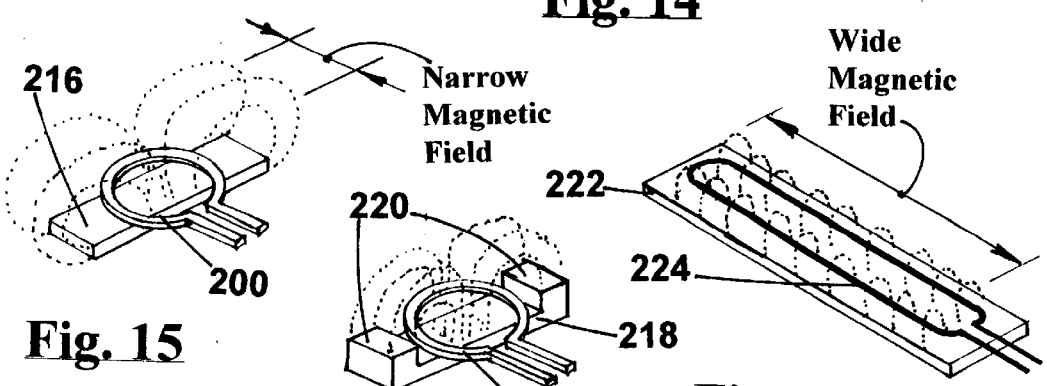

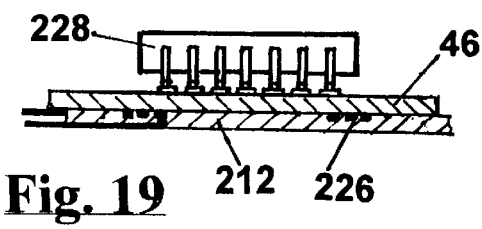
Fig. 19
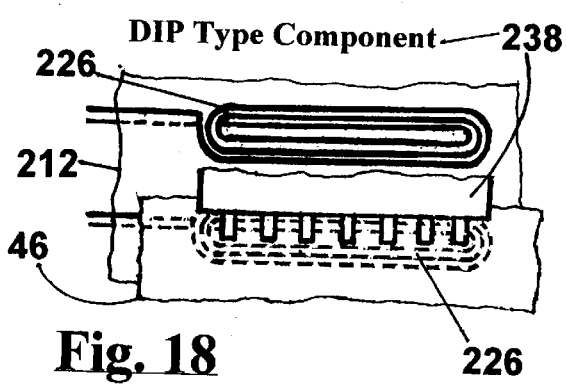
Fig. 18
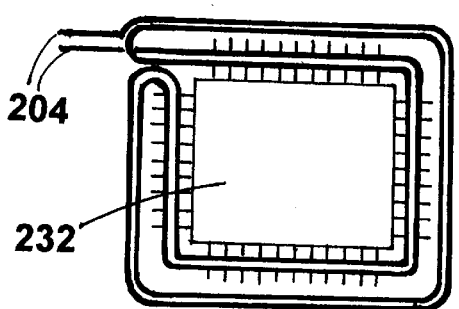
Fig. 20
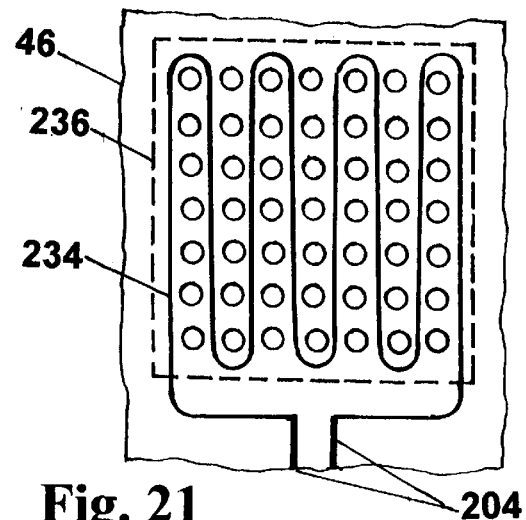
Fig. 21
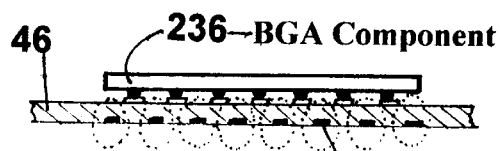
Fig. 22
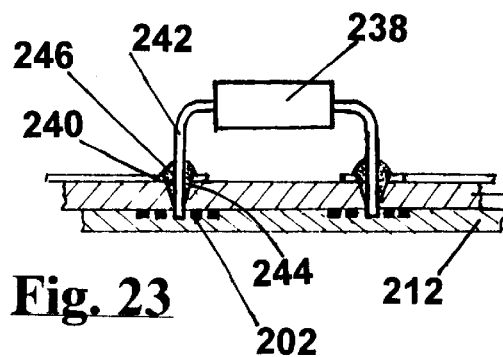
Fig. 23
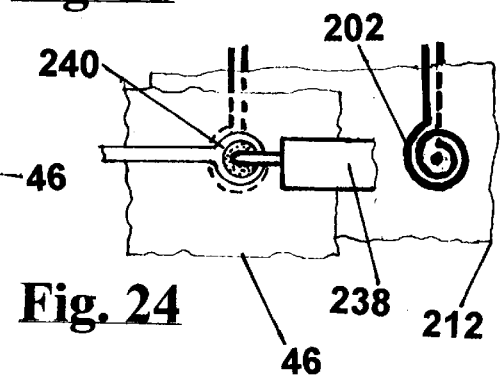
Fig. 24
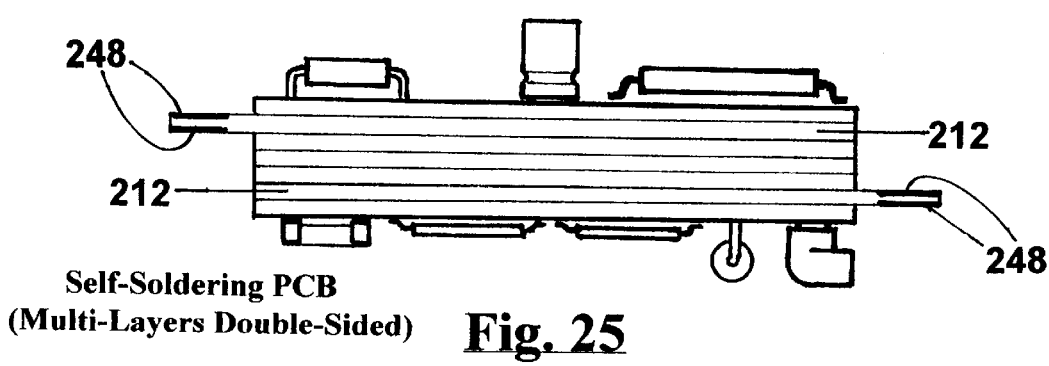
Self-Soldering PCB
(Multi-Layers Double-Sided) Fig. 25

INDUCTIVE SELF-SOLDERING PRINTED CIRCUIT BOARD

This application claims the benefits of U.S. Provisional Patent Application No. 60/125,846 filed Mar. 24, 1999.

This is a continuation-in-part of my Provisional Patent Application No. 60/103,848 filed Oct. 10, 1998 now patent application Ser. No. 09/396,923 filed Sep. 14 1999.

FIELD OF INVENTION

This invention relates to a novel soldering apparatus for joining electronic components to a printed circuit board utilizing localized electromagnetic induction heating.

BACKGROUND-DESCRIPTION OF THE PRIOR ART

The manufacture of most modem electronic products requires a printed circuit board (PCB) that allows to electrically interconnect a variety of electronic components and also holds them together in a relatively rigid condition. Many types of components are placed over a single PCB. Electronic components such as resistors, capacitors, inductors, transformers, integrated circuit (IC) packages, connectors, headers, RF shields, LEDs, switches, board interface systems, battery sockets, etc. are electrically connected and restrained by means of soldered joints. In general, these joints are obtained by three methods: hand soldering, the wave soldering process and by the reflow soldering process.

Manufacturing electronic products around PCBs requires a few sequential steps performed by different machines. For example, such steps may comprise: (1) printing the PCB with soldering paste (an operation generally performed by stencil printing equipment), (2) placing surface-mount electronic components on that PCB face (an operation performed by an automated computer-controlled "pick-and-place" machine or by any other type of component placement equipment), (3) soldering the assembly (an operation, until now, performed inside a reflow oven or by a wave soldering machine), (4) cleaning the completed assembly (an operation that may involve washing and drying) and (5) testing the assembly for proper functionality (detects components damaged during step (3) and the presence of defective soldered joints.) Rework or rejection may be required after operation (5).

Mass production exclusively utilizes wave and reflow soldering processes, either individually or in combination to accomplish above step (3). Both processes exhibit inherit disadvantages that indeed, increase the cost of the final product, generate rejects, require rework and reduce the reliability of the final product. The electronic manufacturing industry accepts these inherit drawbacks and shortcomings, and works around them, for lack of a more suitable soldering process.

Both wave and reflow soldering processes simultaneously heat up the entire electronic product, meaning the PCB and all of the components being soldered to the PCB, to a temperature ranging from about 20° C. (degree Celsius) to 40° C. above the temperature at which the utilized solder alloy melts or reaches liquidus state. The melting temperature of solder alloys utilized by the electronic industry ranges from 190° C. to 300° C.

The majority of consumer electronic products need to be rated, and indeed are, to operate at maximum temperatures that range from 50° C. to 90° C. Consequently, components that form part of every electronic product manufactured by either wave or reflow soldering processes are required to survive temperatures from 120° C. to 290° C. higher than those temperatures encountered during their most severe actual operation. Therefore, all electronic components must be unnecessarily temperature-overrated to tolerate or survive the harsh soldering process. This requirement for high-temperature-exposure survival increases the cost of every component to be soldered to a PCB.

During the soldering process, thermal shock (due to a fast heating rate) can crack certain components, in particular ceramic capacitors, increasing rejects and/or requiring costly rework. Fast heating of plastic IC packages could induce cracking when moisture absorbed inside said packages can turn into steam during a reflow soldering process causing the so called "pop-corn" effect that internally damage the IC package. Electrolytic capacitors are extremely sensitive to high temperature exposure. Laminated PCBs may become soft by extended exposure to heat. An increase in soldering process temperature can damage a PCB metal-plated through-holes or vias, by cracking their barrels due to differential thermal expansion between the PCB dielectric material and its barrels' plating metal. Also, the difference in coefficient of thermal expansion between board and ceramic capacitors can result in significant stress at the soldered joints which may induce cracking. Warpage, or twisting of a PCB, increases with soldering temperature. Warpage can cause defective soldered joints because coplanarity of the mating surfaces is compromised. In addition, defective joints result due to movement of the components from their intended soldering pads location. During a reflow soldering operation, components can move due to the following effects: liquefied-solder surface tension, liquid-solder induced buoyancy, convective gas flow, equipment generated noise and vibration and other well known factors.

Recently, electrically conductive adhesives are becoming increasingly prominent in electronics packaging applications in large part because their ability to provide electrical interconnection without the need to subject the component to the harsh high-temperature environment of a reflow soldering process. Heat sensitive components that could be damaged during reflow process are being electrically interconnected by conductive adhesives. This type of electrical interconnection is not as desirable as traditional soldered joints.

In conclusion, the cost of manufacturing electronic products around PCBs can be reduced and the quality and reliability of said products improved by using the new soldering apparatus and process disclosed in my copending parent patent application Ser. No. 09/396,923. That new soldering process only heats the soldering pads (or lands) on a PCB and the mating leads (or terminations) extending out from electronic component casings, while allowing said casings to remain relatively cold. That novel soldering process permits the elimination of all the disadvantages enumerated above.

When this inventor realized the need to create an alternative device to efficiently implement the process disclosed by said parent application, the objectives and purposes of this invention were inspired, leading him to the conception and the accomplishment of this invention.

OBJECTIVES AND ADVANTAGES OF THE INVENTION

The general objective of this invention is to provide the electronic manufacturing or electronic packaging industry with a new, safe, reliable, speedier and useful device for inductively soldering components to a PCB. Because my invention only heats the leads and pads to be joined by solder while the rest of a component (namely its casing or housing) remains relatively cold, utilization of my invention will help to reduce manufactured-product cost. For example, lower-priced components rated to tolerate much lower temperature exposure (than now required when utilizing reflow or wave solder processes) will be acceptable. My invention eliminates the need to de-moisturize certain components, for example the requirement set by the Joint Electronic Devices Engineering Council (JEDEC) to bake plastic BGAs at 125° C. for 24 hours prior to reflow is eliminated. Also my invention allows to improve the quality and reliability of the manufactured product. My invention helps reduce formation of intermetallic layers inside soldered joints thus improving their robustness. My invention also induces a fast rate of solder solidification resulting in more robust soldered joints. Furthermore, my invention permits in-process and in-situ testing of soldered joints quality, thus allowing rework before final assembly is completed. My invention can solder a typical PCB up to fifty times faster than wave or reflow processes. In addition it provides for a useful de-soldering device. My invention consumes about 200 times less energy than the reflow process. My invention also allows to reduce the required manufacturing floor space.

Further objectives and advantages of my invention will become apparent from a consideration of the drawings and following descriptions.

BRIEF DESCRIPTION OF THE DRAWING FIGURES

FIG. 10 shows, in cross-sectional side view, two flat multi-turns inductor (as integral part of an inductor layer) placed under a single-sided PCB in proper position to solder into said PCB the two joints of a surface-mount component.

FIG. 11 shows, in bottom view, the same components shown in FIG. 10.

FIG. 12 shows, in cross-sectional side view, a double-sided PCB with two components (one placed on each side) plus an inductor layer sandwiched between its top and bottom layers. Four flat multi-turns inductors are embedded into the inductor layer in proper position to solder all the joints of the two components.

FIG. 13 shows, in cross-sectional side view, an inductor layer containing two flat multi-turns inductors and two disks (made of high magnetic-permeabilty material) intended to re-shape said inductors' magnetic field geometry.

FIG. 14 shows, in bottom view, the same components shown in FIG. 13.

FIG. 15 shows, in perspective view, the resulting magnetic field produced by a flat single-turn inductor placed adjacent to a magnetic shield plate.

FIG. 16 shows, in perspective view, the resulting magnetic field produced by a flat single-turn inductor placed adjacent to a U-shaped magnetic shield.

FIG. 17 shows, in perspective view, the resulting magnetic field produced by a elongated flat single-turn inductor placed adjacent to a wide magnetic shield.

FIG. 18 shows, in bottom view, two elongated multi-turns flat inductors place in position to solder all the joints of a DIP type component.

FIG. 19 shows, in side view, the same components shown in FIG. 18.

FIG. 20 shows, in bottom view, a folded flat multi-turns inductor place in position to solder all the joints of a QFP type component.

FIG. 21 shows, in bottom view, a spread flat single-turn inductor placed under a single-sided PCB in proper position to solder all the joints of a BGA-type surface-mount component into said PCB.

FIG. 22 shows, in cross-sectional side view, the same components shown in FIG. 21.

FIG. 23 shows, in side cross-sectional view, a single-sided PCB with an inductor layer attached on its bottom, the layer incorporates two flat multi-turns inductors placed in proper position to solder the two joints of a through-hole type component into said PCB.

FIG. 24 shows, in top view, the same components shown in FIG. 23

FIG. 25 shows, in side view, a multi-layer PCB with two inductor layers that are sandwiched adjacent to its top and bottom surfaces respectively.

REFERENCE NUMERALS IN DRAWINGS

Figure 1:
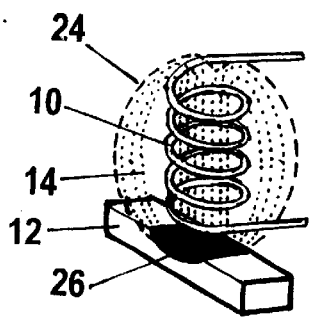
FIG. 1 shows, in perspective view, a rectangular metal bar placed adjacent to a solenoid.

Note that when significantly similar parts (performing a similar function and achieving a similar result) are used by more than one assembly, the same numeral is assigned to that part in different figures. In the following listing those similar parts are denoted by a "(*)" after their names.
For the benefit of those readers that may wish to compare this invention with said parent application the same numerals are used by both applications when identifying similar parts. Numeral denoted by a "(§)" after their names are not cited in the following text. Numerals 200 and higher do not have equivalent in said copending application.

10 solenoid (*)
12 metal bar
14 variable magnetic field
24 boundary of variable magnetic field 14
26 heated zone
28 cylindrical shell, part of 34
30 central rod, part of 34
32 base closure, part of 34
34 magnetic core, part of 44
36 terminals of solenoid 10, part of 44 (*)
38 axis-symmetric air gap
40 variable magnetic field (*)
42 boundary of variable magnetic field 40 (*)
44 cylindrical inductor cell (*)
46 portion (or substrate) of a PCB (*)
48 surface-mount component (*)
50 lead (or termination) of component 48 (*)
52 soldering pad, part of 46 (*)
54 solder paste (*)
66 holding frame, part of 80 (§)
68 top face, part of 80 (§)
70 base face or underside, part of 80 (§)
72 extension wire, part of 80 (§)
74 common extension wire, part of 80 (§)
76 optional cable harness, part of 80 (§)
78 optional interface connector, part of 80 (§)
80 flat matrix inductor (§)
110 flat matrix inductor (equivalent to 80)
112 switching device (*)
114 programmable controller (*)
116 radio-frequency generator (*)
118 individual cell (equivalent to 44)
120 single pole switch (*)
122 single-sided PCB
132 commercially available pick-and-place machine
134 feedback controller
136 solid state switch
200 flat single-turn inductor (*)
202 flat multi-turns inductor (*)
204 terminal, part of 200, 202, 224, 226, 230, and 234 (
206 variable magnetic field (*)
208 variable magnetic field boundary (*)
210 cross-over path in 202 (*)
212 inductor layer (*)
214 magnetic shield disk (*)
216 magnetic shield plate
218 U-shaped magnetic shield
220 protrusion end, part of 218
222 wide magnetic shield
224 elongated flat single-turn inductor
226 elongated flat multi-turns inductor
228 DIP type component
230 folded flat multi-turns inductor
232 QFP type component
234 spread flat single-turn inductor (*)
236 BGA type component
238 through-hole mount component(*)
240 annular solder ring (*)
242 insertion lead
244 PCB hole
246 solder paste
248 edge contact, part of 212 (*)
250 self-soldering PCB (*)
252 interface connector (*)
254 harness cable (*)
256 bank of tuning capacitors (*)
258 tuning capacitor (*)

SUMMARY OF THE INVENTION

This invention discloses a novel inductive soldering apparatus for joining electronic components to a PCB utilizing localized electromagnetic induction heating. Specifically my invention improves the soldering of said components with a new and safe approach. During soldering operation my apparatus only heats the pads-and-leads to be joined by solder, while the main body of the electronic components being soldered and the PCB dielectric material remain relatively cold. As a result, soldered products become of better quality and more reliable and their manufacturing cost is reduced. My apparatus consumes much less energy than, both, reflow ovens and wave soldering equipment.

DESCRIPTION OF ELECTROMAGNETIC INDUCTION HEATING

Before referring specifically to the novel components comprising embodiments of my invention, it is desirable to present an overview of the physics principle governing Electromagnetic Induction Heating (E.I.H.) also designated as Induction Heating. The following description, though simplified and concise, will benefit those readers unfamiliar with the principle and practice of E.I.H. For an in-depth treatment of theory, practice and application of E.I.H. the reader is referred to either: engineering handbooks, textbooks, electric heating trade magazines and journals, industrial heating conference proceedings and data sheets from manufacturers of E.I.H. equipment.

Referring to FIG. 1, if a solenoid 10 (shown adjacent to a metal bar 12) is supplied with an alternating current, a variable magnetic field 14 is generated (inside and around solenoid 10) which in turn induces eddy currents inside adjacent bar 12. The eddy currents are converted into heat by the Joule effect. It is fundamental to recognize that E.I.H. allows to heat metallic bodies (or electric conductors), but not electric insulators, to very high temperatures by a solenoid, winding or coil, that essentially remains cold. Conventional heating uses a heat source having a higher temperature than that of the body to be heated. Heat from the hot source is indiscriminately transferred to all bodies surrounding the source (indistinctly if the body is an electric conductor or an electric insulator.) Heat can be transferred by conduction, convection, radiation or a combination of the three mechanisms.

FIG. 1 shows a shaded region 26 representing where most of the heat induced by the variable magnetic field 14 is localized. In other words, electric currents flowing through bar 12 concentrate near the surface. Consequently, temperatures induced inside bar 12 decrease from the surface toward the center. This phenomenon is known as skin effect. If bar 12 is placed outside the variable magnetic field boundary 24 it will remain unheated. Consequently any region of a component subjected to E.I.H. can be protected from being heated by placing the desired region outside the—effective—boundary (or envelope) of the corresponding variable magnetic field. As will be shown below, the variable magnetic field boundary 24 can be shaped by proper design to exclude adjacent regions not to be heated. In free space, a variable magnetic field 14 extends to infinitive while its intensity (number of lines per unit area) rapidly decreases, away from solenoid 10, approaching zero level. It is convenient to define a boundary 24 as a surface limiting the spatial extent of field 14 to an arbitrary non-zero intensity, say, no lower than 5% of its maximum level. Beyond boundary 24 field 14, for all practical purposes, should be considered ineffective. The same conceptual definition will be adopted below when introducing boundaries 42 and 208.

FIG. 1 shows a particular case of non-symmetrical E.I.H, however, E.I.H. is applicable to non-symmetrical as well axis-symmetrical configurations. Neither the variable magnetic field nor the part to be heated need to be symmetrical. Furthermore, the part to be heated can be placed adjacent to or inside a solenoid to achieve heating. In the above explanation it was assumed that the E.I.H. process was applied for a short duration (a transient application of energy) thus allowing to assume that heat transferred, or its migration, by conduction inside bar 12 was insignificant.

In order to simplify FIG. 1 doted-line paths representing magnetic field 14 are omitted where traversing (or extending) inside bar 12. The same approach was adopted to represent variable magnetic fields in subsequent figures.

The power converted into heat by E.I.H. depends on: (1) the electrical resistivity of the material being heated, (2) the magnetic permeability of the material being heated and (3) the frequency of the current flowing through the solenoid. When a part to be heated is made from a magnetic material such as iron (also various types of steel, cobalt, etc.) the heat dissipated by the magnetic hysterisis characterizing such materials, is added to the above described magnetically induced heat. However, in most cases, the heat dissipated by hysterisis is less than 10% of the heat generated by induced currents.

To complement the above description of the E.I.H. process it is important to explicate how the three parameters cited above affect the penetration of induced currents. At the surface of the part being heated, the maximum induced current density concentrates and its level decreases from the surface toward the center in a exponential fashion. The higher the frequency of the current flowing through solenoid 10, the greater the tendency of the induced current to concentrate nearer to the surface of the part being heated. More specifically, the current penetration depth, also known as skin thickness, is directly proportional to the square root of the electric resistivity of the part being heated and inversely proportional to the square root of both the magnetic permeability of the part being heated and the frequency of the current flowing through solenoid 10. Consequently, if a part needs to be heated uniformly throughout its thickness, relatively low frequency should be chosen. Conversely, if the heat should be concentrated on the surface of the part then relatively high frequency must be utilized.

For our primary application, assembly of electronic components on PCBs, it is sufficient, and sometimes preferable, to heat the surface of the joints to be soldered but not to heat uniformly through their thickness. Typical thickness of a copper connector or PCB pad to be soldered could be about one tenth of a millimeter (0.1 mm). If we wish to restrict the induced heat to within one hundredth of a millimeter (0.01 mm) from the surface, it will require a current frequency of about 100 MHz. If the copper is replaced by steel material, the needed current frequency to obtain the same heating result should be of the order of 10 MHz. The frequency selection also depends on the geometry of the part to be heated and the heating rate desired.

Summarizing, E.I.H. exhibits three important properties that are advantageously exploited by my invention, namely: (1) direct creation of localized heat inside the part to be heated without utilizing a hot source, (2) very low thermal inertia and (3) very high heat (or power density) concentration on the surface of the part being heated. The E.I.H. process can induce or deliver heat rate per unit surface area, up to 100 times higher than those transferred by a reflow soldering process. Now that the fundamentals of E.I.H. have been described, I shall proceed with the description of a specialized solenoid-configuration that will, later on, help to understand how and why my invention works.

Figure 2:
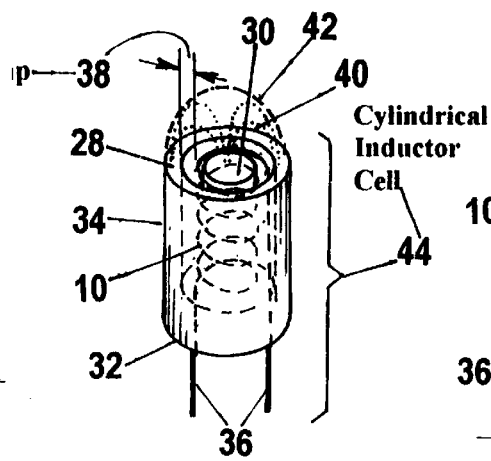
FIG. 2 shows, in perspective view, a solenoid wound around and inside a ferromagnetic core forming a cylindrical inductor cell.

FIG. 2 shows, in perspective view, solenoid 10 wound inside a cylindrical shell 28 and around a central rod 30. Shell 28 and rod 30 are joined through a base closure 32 forming an integral magnetic core 34. Solenoid 10 has its two terminals 36—36 extended outside core 34 by feeding through closure 32 wall. Core 34 presents a magnetic path discontinuity on its top, shaped as an axis-symmetric air gap 38. The complete core 34 is made of high permeability material that exhibits low hysterisis losses such as ferrite or equivalent. When terminals 36—36 are supplied with an alternating current, this specific configuration produces an axis-symmetric variable magnetic field 40 confined within a dome-shaped boundary 42. Magnetic field 40 is concentrated and thus more intense (higher flux, measured in webers) than the previously described magnetic field 14 which is produced by an open-air solenoid. The inclusion of core 34 around-and-inside solenoid 10 results in self-shielding of most of the variable magnetic field, allowing the field to only emanate through air gap 38. The assembly comprising solenoid 10, core 34 and terminals 36—36 will be referred to as a cylindrical inductor cell 44.

Figure 3:
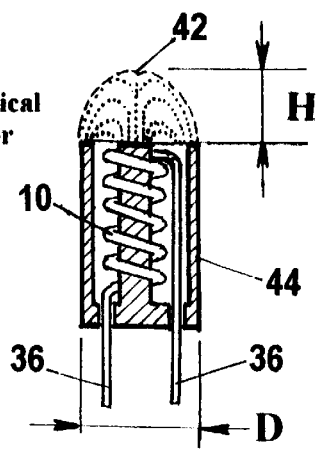
FIG. 3 shows, in cross section, the assembly shown in FIG. 2.

To further clarify some important properties of cored inductors, FIG. 3 shows in cross-sectional view, the same inductor cell 44 shown in FIG. 2. It is important to recognize that the height H of boundary 42 is proportional (among other parameters) to the outside diameter D of inductor cell 44 and to the magnetomotive force (given in ampere-turns) produced by solenoid 10 when supplied with an alternating current. The maximum height H that a boundary 42 can reach is limited by the saturation flux density characterizing the material forming magnetic core 34.

Figure 4:
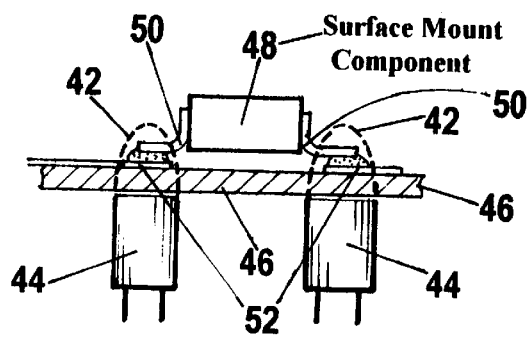
FIG. 4 shows, in side view, two inductor cells placed under a PCB in proper position to solder the two joints of a surface-mount component into said PCB.

FIG. 4 shows a PCB 46 with a component 48 and a pair of inductor cells 44—44 placed under PCB 46 such as that their individual boundaries 42—42 each engulfs a set of mating lead 50 and pad 52. Notice that the main central portion or body of component 48 remains outside boundaries 42—42. If an alternating current is simultaneously supplied to both inductor cells 44—44, then both leads 50—50 will be soldered to pads 52—52 at the same time. Notice that the main body of component 48 is not being heated because it lays outside both boundaries 42—42.

Many electronic components soldered to PCBs contain inside their casing electrically conductive materials that will be heated if submerged inside a variable magnetic field. Furthermore, internally located electrically conductive parts will heat up much faster than its external leads because, in general, they have a much smaller—thermal mass—than that of its external leads. Said internal parts could reach much higher temperatures than those of the leads been soldered. As a result such components could be damaged by overheating thus defeating and invalidating the objectives of this invention. Consequently it is imperative that internal parts remains outside boundaries 42 to avoid being heated.

Figure 5:
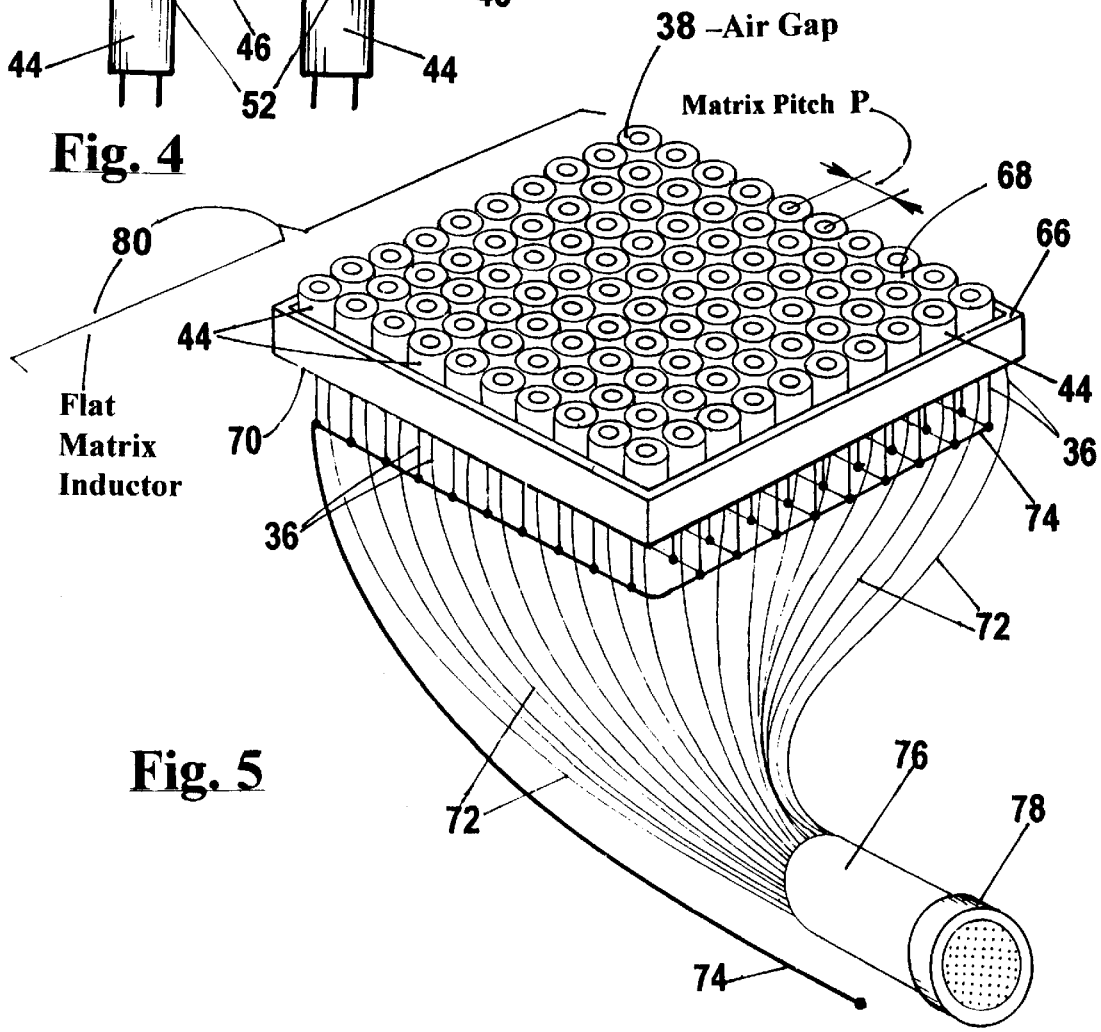
FIG. 5 shows, in perspective view, a multiplicity of cylindrical inductor cells held together by a frame to form a flat matrix inductor.

FIG. 5 shows, in perspective view, a multiplicity of cylindrical inductor cells 44 placed side-by-side conforming to a matrix arrangement and held together by an encircling or holding frame 66. Cells' 44 individual air gaps 38 are all facing in the same direction, upwards, and are all contained on a flat upper surface, or top face 68. From every inductor cell 44, a pair of terminals 36—36 emerges beneath the underside or base face 70. One terminal 36 from each and every inductor cell 44 is outfitted with an extension wire 72. The other remaining terminals 36 are all interconnected together and outfitted with a common extension wire 74. The multiplicity of wires 72 can be bundled into an optional cable harness 76 that terminates into an optional interface connector 78. The grouped assembly comprising the multiplicity of inductor cells 44, frame 66, the multiplicity of wires 72 and wire 74, form what we shall call a flat matrix inductor 80. If an alternating current is simultaneously supplied to every individual inductor cell 44 forming part of matrix inductor 80, a multiplicity of variable magnetic fields 40 (not shown in FIG. 5) will emanate upward from top face 68 forming a—carpet-like magnetic field—of finite thickness.

E.I.H. prior-art customized to solder a specific component into a PCB is found in the three following patents; (1) U.S. Pat. No. 4,789,767 Autoregulating Multi Contact Induction Heater issued Dec. 6, 1988 that teaches how to solder a multi-pin connector to a PCB, (2) U.S. Pat. No. 4,795,870 Conductive Member Having Integrated Self-regulating Heaters issued Jan. 3, 1989 that teaches how to solder a bus bar to a PCB and (3) U.S. Pat. NO. 4,983,804 Localized Soldering by Inductive Heating issued Jan. 8, 1991 that teaches how to solder a flexible circuit to a PCB. Non of the above cited patents pursue neither the objectives nor the approach of my invention. Their scope and claims are totally different from those of my invention.

Figure 6:
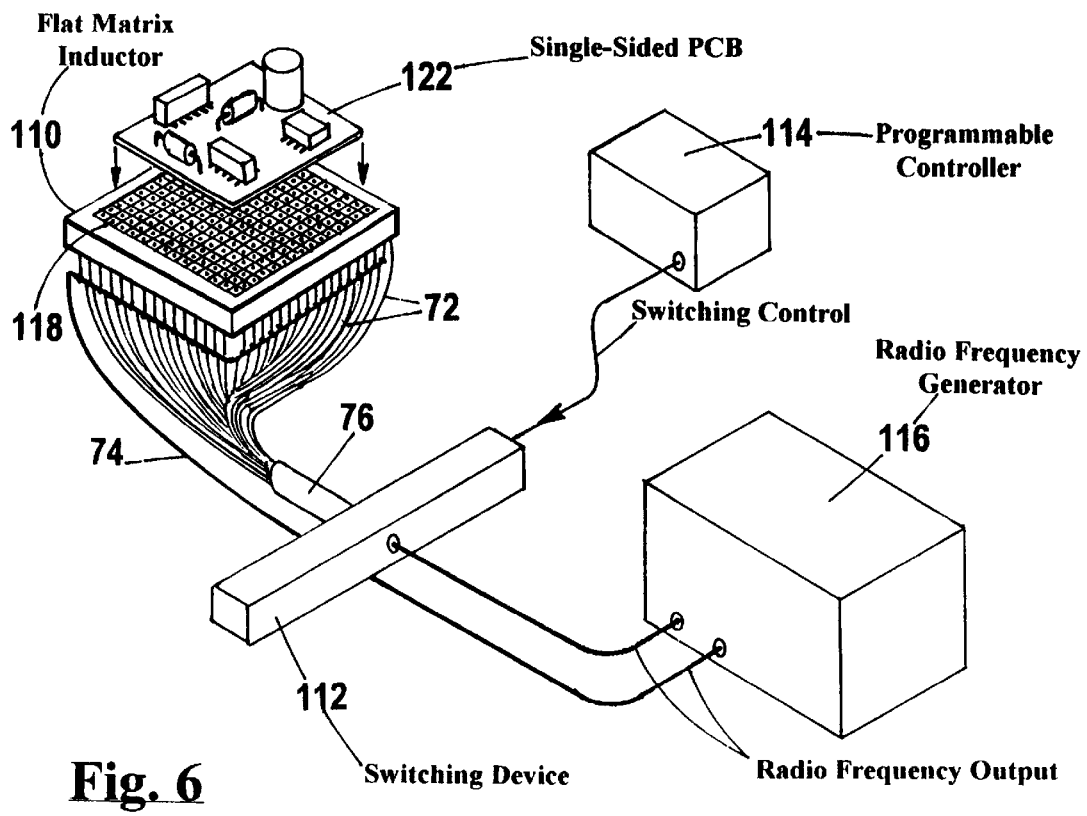
FIG. 6 shows, in perspective view, an embodiment of said parent application. comprising a flat matrix inductor.

To complete this description of E.I.H. it is desirable to present a specific embodiment disclosed in said copending parent application because it will assist the reader to understand the underlying concepts common to both inventions, the un-obvious new matter disclosed by this invention as well as the objectives of this invention. FIG. 6 illustrated one particular embodiment that comprise a flat matrix inductor 110 (itself comprising a set of inductor cells 118, similar to inductor cell 44, arrangement in rows-and-columns as in the case of inductor 80 shown in FIG. 5), a switching device 112, a programmable controller 114 and a radio-frequency generator 116. Each cell 118 is capable of being electrically connected in parallel to generator 116 by means of device 112. Device 112 comprises a multiplicity of single-pole switches 120 (not shown in FIG. 6) that are capable of connecting each cell 118 to generator 116 independently of other cells 118 for a different duration of time under control, or instruction, exerted by said controller 114 upon said device 112. Generator 116 is capable of supplying an alternating current controllable in intensity and frequency. Switches 120 (preferably of the normally open type) could be either mechanical toggle-switch, electromechanical relay or solid-state relay. Said controller 114 could be of various kinds; mechanical, electromechanical or solid state type.

In operation, a single-sided PCB 122 already including a multiplicity of diverse electronic components ready to be soldered is placed and held on the top face of said inductor 110, subsequently said generator 116 is activated and then every particular switch 120, that connects an individual cell 118 positioned under a joint to be soldered, is closed for a predetermined time duration sufficiently long to achieve melting of solder alloy to successfully solder the corresponding joints. Said particular switches 120 can all be closed simultaneously or in a sequential grouped manner.

Notice that said controller 114 can be eliminated from the above embodiment; in that case, device 112 is manually preset to connect generator 116 to inductor 110 in a predetermined electrical manner. Furthermore, said inductor 110 could be directly connected (hard wired) to said generator 116 eliminating the need for both, said device 112 and said controller 114. Both embodiments will connect all individual cells positioned under joints to be soldered for the same time duration. This approach is acceptable and efficient when all the joints to be soldered exhibit almost identical thermal mass.

The fundamental objective of this invention is to replace the above cited "flat matrix inductor 110" and any other matrix inductors utilized by said copending parent application with an operationally equivalent, but totally different, novel and non-obvious tool that is permanently built-into the PCB to be soldered. In essence this invention, unlike said copending parent application utilizes a "use-once" soldering tool.

Notice that matrix inductor 110, and all of its equivalent, incorporate a plurality of miniature solenoids 10 that should be manufactured utilizing "wire wound technology" to form them. With wire wound technology there is a practical limit on how small solenoids 10 can be produced. Consequently, when trying to solder extra-fine pitch electronic components the applicability of the apparatus of said parent application may not be very efficient.

However, with the present invention wire wound technology is not required thus permitting to extend the applicability of localized E.I.H. soldering to extra-fine pitch electronic components and, in addition, to "odd-form" components as well as straddle-mount components.

Fine and extra-fine pitch is found in advanced packages with high lead count (or high input/output (I/O) such as; pin-grid-array (PGA), ball-grid-array (BGA), fine-pitch quad flat package (QFP), etc. Presently, BGAs with 0.6 millimeter center-to-center ball pattern are not uncommon, yet smaller-pitch components will be required to be soldered in the future as the electronic industry continues its trend toward chip scale packaging (CSP) with the intent of increasing the number of I/O per square inch.

DESCRIPTION OF INVENTION

Now, aided by FIGS. 7 through 25, I shall illustrate and describe the novel and non-obvious components that form part of the embodiments of this invention. Because the actual embodiments of my invention also include items-of-commerce recognized as public-domain prior-art, the preferred embodiments will be illustrated afterwards in FIGS. 26 through 30 and described in the next part of this specification.

Figure 7:
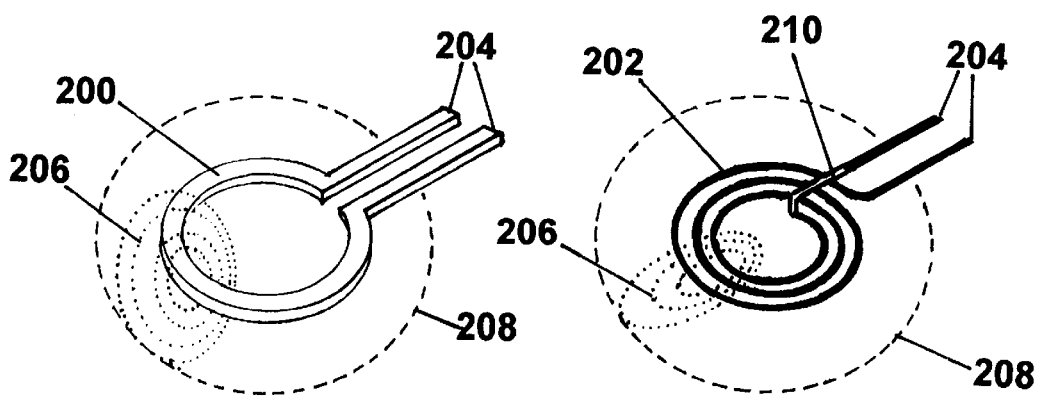
FIG. 7 shows, in perspective view, two basic "flat" inductors, a single-turn configuration and a multi-turns configuration.

FIG. 7 shows, in perspective view, two basic (or simple) types of "flat" inductors that are useful for the accomplishment of this invention, (a) a flat single-turn inductor 200 and (b) a flat multi-turns inductor 202. When the two terminals 204—204 of these inductors are supplied with an alternating current each inductor generates its own variable magnetic field 206, each individual field is contained within their own variable magnetic field boundary 208 (an open-air boundary 208 is symmetric about the plane containing the flat inductor.) Notice that both terminals 204—204 of inductor 200 are contained on a single plane. However, terminals 204—204 of multi-turns inductor 202 can not be located on a single plane because one of the terminals must be routed under (or above) the multi-turns without touching them in order to prevent electric short, see (un-shaded) cross-over path 210. To avoid unnecessary agglomeration of lines in FIG. 7, only one set of doted-line paths representing magnetic fields 206 are depicted in the figure.

For a given intensity of alternating current, inductor 202 produces a stronger magnetic field than inductor 200 because the strength (or magnetomotive force) of a variable magnetic field is measured in ampere-turns. Conversely, if a single-turn inductor is supplied with a higher current it would be capable of inducing a magnetic field of same strength as a multi-turns inductor.

At the point where the terminals 204 and the turn (or coil) join, the magnetic field is weaker, this effect is less prominent in multi-turns inductors, as the number of turns increases this condition becomes less important and the inductor delivers a more uniform heating.

Flat multi-turns inductors are in general more energy efficient because its inductance, unlike flat single-turn inductors, is much larger than those of the leads connecting it to the supply of alternating current, therefore less energy is lost through the leads. In general, flat multi-turns inductors seem to be better suitable for delivering higher localized energy (or heat) than flat single-turn inductors during same heating-cycle time.

Figure 8:
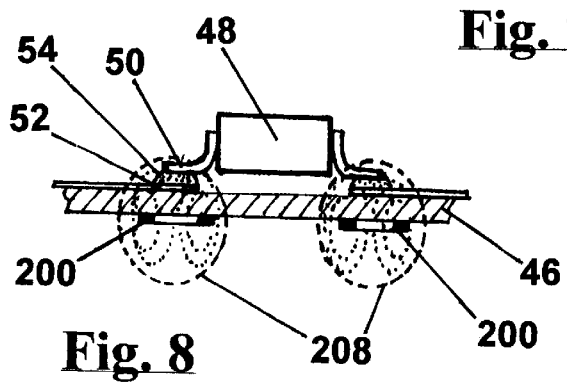
FIG. 8 shows, in cross-sectional side view, two flat single-turn inductors placed under a single-sided PCB in proper position to solder the two joints of a surface-mount component into said PCB.
Figure 9:
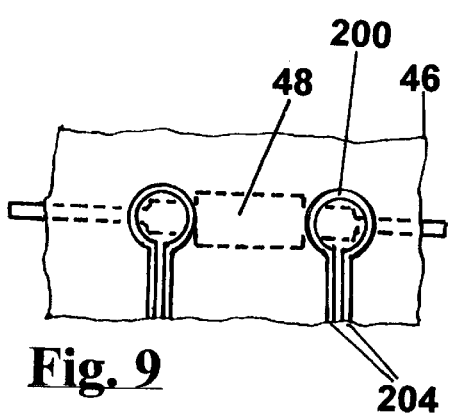
FIG. 9 shows, in bottom view, the same components shown in FIG. 8.

FIG. 8 shows, in cross-sectional side view, the utilization of two flat single-turn inductors 200—200 to accomplish the soldering of a surface-mount component 48 into PCB 46. Inductors 200—200 are placed under the leads 50—50 and solder pads 52—52 of component 48 such as that their boundaries 208—208 only engulf them but not the body of component 48 otherwise we risk that part of the component's body becomes heated. These flat single-turn inductors are permanently attached to the underside of PCB 46 (this type of inductor can be produced by any manufacturing process capable of generating traces and soldering pads on PCBs.) FIG. 9 shows, in bottom view, the parts shown in FIG. 8.

FIG. 10 shows, in cross-sectional side view, the utilization of two flat multi-turn inductors 202—202 to accomplish the soldering of a surface-mount component 48 into PCB 46. Inductors 202—202 are placed under the leads 50—50 and solder pads 52—52 of component 48 such as that their boundaries 208—208 only engulf them but not the body of component 48 otherwise we risk that part of the component's body becomes heated. These flat multi-turns inductors are permanently attached to the underside of PCB 46 but they require an additional layer of substrate in order to permit the placement of cross-over path 210. Consequently, flat multi-turns inductors require an additional layer of substrate 212. It is feasible to avoid the use of the additional layer by routing the cross-over 210 path over the top side of the single-sided PCB 46, nevertheless this approach may be difficult to implement with highly populated boards. Flat multi-turns inductors can be produced by any manufacturing process capable of creating traces, soldering pads and vias on PCBs. FIG. 11 shows, in bottom view, the parts shown in FIG. 10.

FIG. 12 shows, in cross-sectional side view, a portion of a double-sided PCB incorporating four flat multi-turns inductors 202 properly located to solder two surface-mount components 48—48 (one placed on each side of said board.) Notice that the board is composed of three layers, the middle (or sandwiched) layer 212 hereinafter shall be referred to as—inductor layer 212. It is important to recognize that with double-sided PCBs the soldering pads on each side of the PCB should not be placed on top of (or facing, or overlapping) each other to avoid simultaneous heating (by a flat inductor) of component's joints placed on both sides of the PCB. Their placement (or layout) should be staggered as shown in FIG. 12. The figure depicts the lines of variable magnetic field 206 symmetrically emanating from opposite sides of the plane containing inductor 202. Notice that two of the corresponding boundaries 208—208 just about reach the body of components 48—48 introducing the possibility for heating said bodies and for potentially defeating the objectives of this invention.

In those special cases where there is an unacceptable risk of inducing unwanted heating, the condition is corrected by utilizing the inductor design shown in FIGS. 13 and 14. The design prevents the emanation of magnetic field toward the unwanted direction. FIG. 13 shows, in cross-sectional side view, two flat multi-turns inductors 202—202 (one embedded on each side of inductor layer 212) each outfitted with a magnetic shield disk 214 made of high magnetic-permeability material that exhibits low hysterisis losses. Disk 214 causes the respective variable magnetic fields 206 to only emanate from one side of layer 212. Disk 214 presents a path of much lesser resistance (or lesser magnetic reluctance) than dielectric materials thus forcing the magnetic field's path lines to traverse through its thickness. Essentially, disk 214 assists in partially shielding and re-shaping the variable magnetic field 206 in a manner similar to that of the case of magnetic core 34 shown in FIG. 2. Other magnetic shield geometry are suitable to be incorporated into a inductor layer 212. Some useful configurations are described below.

FIG. 15 shows, in perspective view, a magnetic shield plate 216 placed adjacent to a flat single-turn inductor 200. Shield 216 causes the magnetic field to be concentrated and narrow.

FIG. 16 shows, in perspective view, a U-shaped magnetic shield 218 placed adjacent to a flat single-turn inductor 200. Shield 218 causes the magnetic field to be narrower and more concentrated than the case of FIG. 15 because the magnetic field emanates upwards from protrusion ends 220—220.

FIG. 17 shows, in perspective view, a wide magnetic shield 222 placed adjacent to an elongated flat single-turn inductor 224. Shield 222 causes the magnetic field to be concentrated and wide.

In most applications the components to be soldered into a PCB have a high number of leads (or terminations) with very close spacing (pitch less than one millimeter in some cases.) The single-turn and multi-turns inductors described above will not be adequate for those cases. Nevertheless, the basic or simple geometry of flat inductors shown in FIGS. 7 through 17 can be modified and tailored, to properly solder in a single operation all the leads of any type of electronic component.

FIG. 18 shows, in top view, two elongated flat multi-turns inductors 226—226 that permits to simultaneously solder all the terminations of a DIP type component 228 (of which one half is shown in the figure.) FIG. 19 shows, in side view, the components shown in FIG. 18.

FIG. 20 shows, in bottom view, a folded flat multi-turns inductor 230 that permits to simultaneously solder all the terminations of a QFP type component 232.

FIG. 21 shows, in bottom view, a spread flat single-turn inductor 234 that permits to simultaneously solder all the bumps of a BGA type component 236. FIG. 22 shows, in cross-sectional side view, the same components shown in FIG. 21. Notice that inductor 234, in essence, is a geometric variation of a flat single-turn inductor and, as such, requires no cross-over path 210. Therefore, inductor 234 does not require the addition of an inductor layer, it can be readily integrated into the underside of a single-sided PCB. Although not shown, notice that inductor 234 can also be configured as a multi-turn inductor that requires the addition of an inductor layer.

Until now I limited the above description of the application of my invention to surface-mount components only, as depicted in FIGS. 8 through 22. Nevertheless, my invention is equally applicable for soldering through-hole mount components. To illustrate this claim, FIGS. 23 and 24 depict, in side view and bottom view respectively, a through-hole mount component 238 ready to be soldered to annular solder rings 240—240 that are part of PCB 46. Component 238 has a pair of insertion leads 242—242 shown inserted into PCB holes 244—244. Solder paste 246—246 is deposited between ring 240 and lead 242. One flat multi-turns inductor 202 is placed under and around each PCB hole 244. This inductor set up is also applicable for localized heating of plated through-holes or vias.

In practice a PCB contains numerous components that may need to be soldered simultaneously. One of the objectives of my invention is to provide means to solder a plurality of electronic components to a PCB with a single soldering tool and during a single-step operation. Notice that those electronic components are characterized by incorporating leads (or terminations) different in type, shape and size, with different number of leads per component, and with different spacing among themselves. It is evident that a PCB designed and manufactured according to my invention may have to incorporate a plurality of diverse flat inductors. Perhaps combining in a single board, all the types shown and described by FIGS. 8 through 24 and/or obvious equivalent variations of the configurations shown. All the terminals 204 from each flat inductor must be routed (by traces) to terminate at an optional interface connector that will allow for the supply of a predetermined alternating current to feed each individual flat inductor. The routing could utilize a common trace or common return that in certain cases could act as a ground plane. Some flat inductors could be connected among themselves in series depending on theirs specific design goals and soldering objectives. The routing of said traces and the location of interface connectors on the PCB will not be further examined herein because said task is obvious to those readers skilled in the art of designing and fabricating PCBs for the electronics packaging industry. A correct design should minimize the space between each pair of terminals 204 and also between the pair of prolongation traces in order to reduce their own inductance. These parasitic inductances, when appreciable, could induce "unintended" heating into adjacent components and, also, could hinder attempts for obtaining impedance matching between a radio frequency generator 116 and a flat inductor (see discussion on impedance matching farther below.)

FIG. 25 shows, in side view, a multi-layer double-sided PCB with component attached to its top and bottom surfaces (or layers.) Two inductor layers 212—212 are sandwiched, one adjacent to the PCB's top layer and one to its bottom layer. Each inductor layer 212 contains all the different inductors (not shown in the figure) required and suitable, for soldering all the components placed on the adjacent external layer. Both inductor layers 212—212 are shown extending out from the lateral sides of the multi-layer PCB envelope. This configuration allows to accommodate edge contacts 248 that will permit to interface (via an edge card connector) with the source of alternating current (preferable within the radio frequency range) necessary for delivering localized heating to the joints to be soldered.

Figure 26:
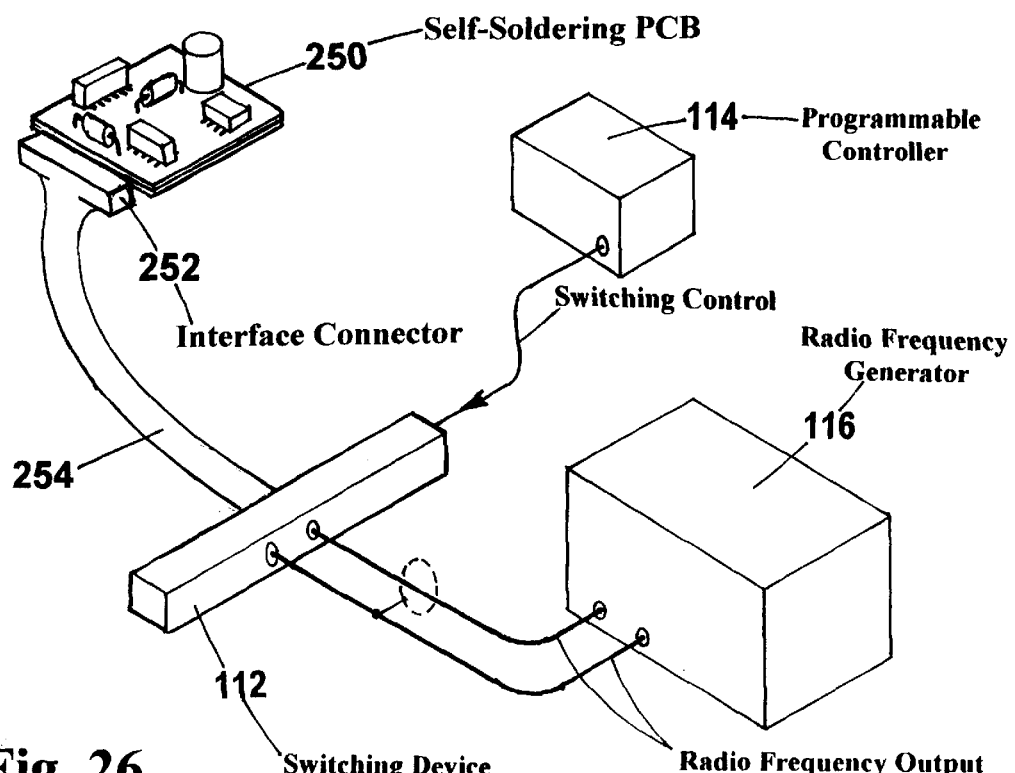
FIG. 26 shows, in perspective view, an embodiment of this invention capable of performing a PCB soldering operation as a stand-alone unit.

A sequential soldering operation is achieved by only supplying with an alternating current to the individual inductors laying beneath the joints to be soldered during a particular sequential step. The remaining inductors stay electrically (or electromagnetically) inactive until a predetermined step sequence is reached. The particular electrical connection that satisfies this requirement for soldering (during each sequential step) some or all of the electronic components will be referred to as a predetermined electrical connection. The above described soldering operation is to be performed by a stand-alone unit as shown in FIG. 26. The stand-alone unit replaces both, the reflow and wave soldering equipments.

Already soldered components can be promptly de-soldered by supplying alternating current to all the flat inductors laying beneath its soldered joints to be de-soldered.

An alternative to the stand-alone approach of my apparatus, is to make my invention work in cooperation with a commercially available pick-and-place machine as described below.

Hereinafter in the description, it should be understood that: (1) the term flat inductor indistinctly refers and applies to, each and any flat inductors depicted in FIGS. 7 through 24 and to any functionally equivalent flat inductor, (2) the term inductor layer refers and applies to a substrate layer that incorporates any number and combination of flat inductors plus the required routing traces and input contacts (or interface connector) necessary to supply alternating current to all and every flat inductor contained into said substrate layer and (3) the term self-soldering PCB refers and applies to any type of printed circuit board (PCB) that incorporates flat inductors and/or an inductor layer (or multiple inductor layers) such as that it will permit to deliver localized heating to the joints to be soldered onto said self-soldering PCB.

In mass production applications, solder paste is precisely deposited on the soldering pads of a self-soldering PCB by a stencil printing process or, alternatively, the PCB is already manufactured with a layer of Solid Solder Deposit (SSD) over each pad to be soldered (the stencil printing process is not required at the assembly floor.) Then, prior to the soldering operation, placement of all electronic components over said PCB is accomplished by an automated computer-controlled—pick-and-place machine—that has a work holder platform where said PCB is held while said machine places different components, one at the time, with high accuracy and high throughput. Typically, the—pick-and-place cycle—for placing a component consumes from 1 to 2 seconds. After all components are placed, the self-soldering PCB is ready for inductive soldering operation by utilizing this invention in a stand-alone mode.

Notice that, if a self-soldering PCB is placed on the work holder of a pick-and-place machine, the soldering of each component can be safely accomplished, one at a time, during each individual pick-and-place cycle that said pick-and-place machine performs. The soldering operation of an individual component utilizing my invention can be accomplished in about the same time as a pick-and-place cycle duration provided that; (a) specially formulated solder paste is utilizes or, (b) a self-soldering PCB with SSD is utilized. During a pick-and-place cycle, a component is grabbed and held by a vacuum cup that is the termination end of said machine's—pick-and-place head. A pick-and-place cycle terminates by releasing the component on said self-soldering PCB at a predetermined location. Alternating current is then supplied to all the flat inductors laying beneath the joints of the component just placed on the face of the self-soldering PCB. If the component is held in place by the pick-and-place head (vacuum cup) during the melting and solidification of solder alloy, any possible movement of the component while being soldered is eliminated. The ability to restrain a component while been soldered (by working in cooperation with a pick-and-place machine) is a very important and unique advantage that can only be accomplished with my invention (without the use of pre-placed holding clips or adhesives.)

Normally, a component being soldered by the reflow process is prone to move during the soldering cycle under the action of unbalanced forces due to liquid solder surface tension, component buoyancy while solder is liquefied, solder running from pads into traces, forces generated by forced-convection gas flow, equipment vibration, environment noise, etc. A part that moves during the soldering cycle results in misalignment between pads, solder paste and leads. Such a movement could cause weak joints, open joints and solder bridging (or shorts) between adjacent pads and/or traces.

An additional unique advantage that can only be accomplished with my invention is the ability to perform solder-quality tests immediately after each component has been soldered. If a defect is found (after the respective pick-and-place cycle is completed), the joint can be re-melted in-situ. Already soldered defective components can be promptly de-soldered by supplying alternating current to all the flat inductors laying beneath its soldered joints.

Under the scope of this invention, a self-soldering PCB does not need to be capable of, or intended to, solder all and every component that needs to be soldered on it. Therefore, self-soldering PCBs can be designed and fabricated to only solder a few specific components. For example, components that: (a) cannot be placed on the board by automated equipment (odd-form components such as: connectors, transformers, relays, shields, straddle-mounts, etc.) or, (b) cannot, or should not, be subjected to the harsh high-temperature environment of a reflow or wave soldering process (heat-sensitive components such as: crystal oscillators, electrolytic capacitors, miniature speakers, etc.) This "selective" self-soldering approach can efficiently and advantageously complement and/or supplement both the reflow and wave soldering processes. For example, a partially assembled self-soldering PCB after been processed throughout a reflow and/or wave soldering step can be completed, as an assembly, by placing on it additional specific components that subsequently are soldered by the method of this invention.

DESCRIPTION OF INVENTION IN PREFERRED EMBODIMENTS

Figure 27:
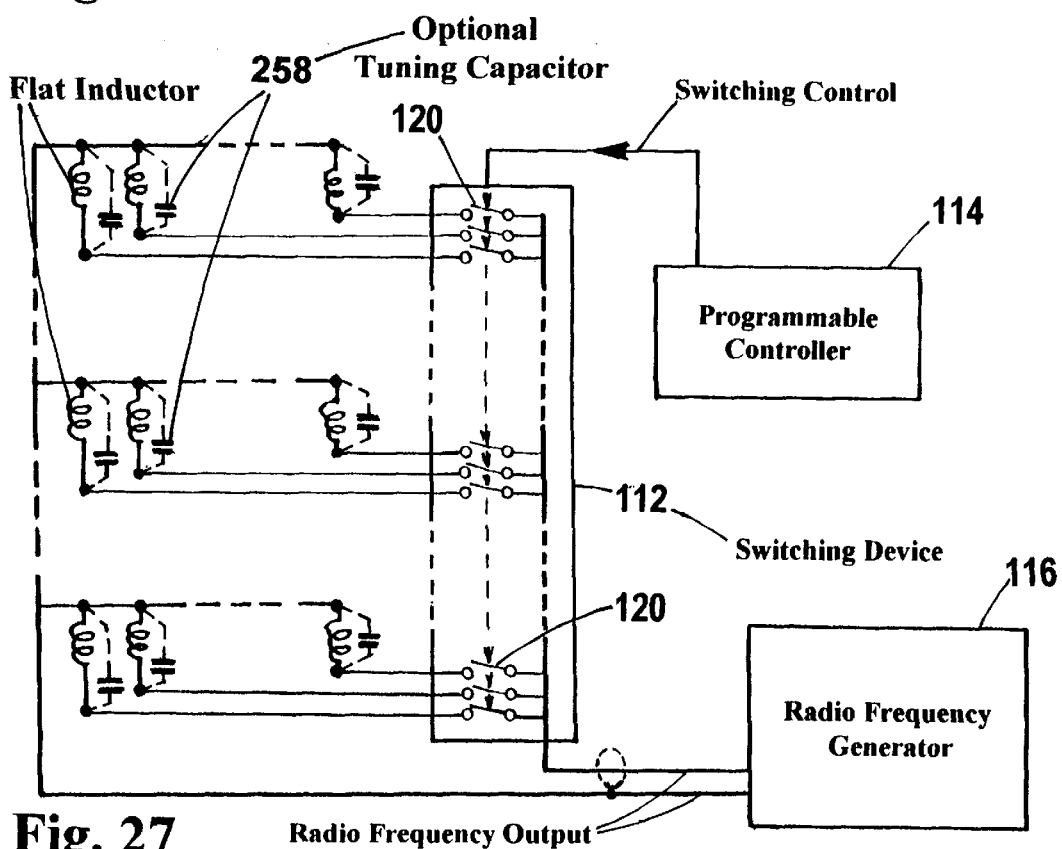
FIG. 27 shows an electric block-diagram corresponding to the embodiment of FIG. 26.

Referring now specifically to the entirety of my invention, a typical embodiment of my invention is shown in FIG. 26 illustrated in accordance with the objectives of my invention by comprising a self-soldering PCB 250, a switching device 112, a programmable controller 114 and a radio-frequency generator 116. Self-soldering PCB 250 contains (embedded) a multiplicity of flat inductors not shown in this figure, each individual flat inductor is capable of being electrically connected to generator 116 by means of device 112. Device 112 comprises a multiplicity of single-pole switches 120 (not shown in FIG. 26) that makes it capable of connecting each individual flat inductor contained into PCB 250 to generator 116 (independently of other individual flat inductors) for a predetermined duration of time, by the controlling action of said programmable controller 114. Generator 116 is capable of supplying an alternating current controllable in intensity and frequency. The electrical schematic corresponding to the embodiment illustrated in FIG. 26 is illustrated in FIG. 27.

In operation, self-soldering PCB 250 already including a multiplicity of pre-placed diverse electronic components ready to be soldered (with solder paste or alternatively SSD placed between the joints to be soldered), is placed on a work holder (not shown.) Subsequently, said generator 116 is activated and then every switch 120 that connects an individual flat inductor positioned under a joint (or joints) to be soldered, is closed for a predetermined time duration sufficiently long to achieve melting of solder alloy and successfully solder the corresponding joint. Said particular switches 120 can all be closed simultaneously, in sequential groups or individually.

Notice that said controller 114 can be eliminated from the above embodiment. In that case, device 112 is manually preset to connect generator 116 to self-soldering PCB 250 in a predetermined manner and/or sequence. Furthermore, said self-soldering PCB 250 could be directly connected (hard wired) to said generator 116 eliminating the need for both said device 112 and said controller 114. Such embodiment will connect all individual flat inductors for the same time duration. This approach is acceptable and efficient when all the joints to be soldered exhibit almost identical thermal mass.

Figure 28:
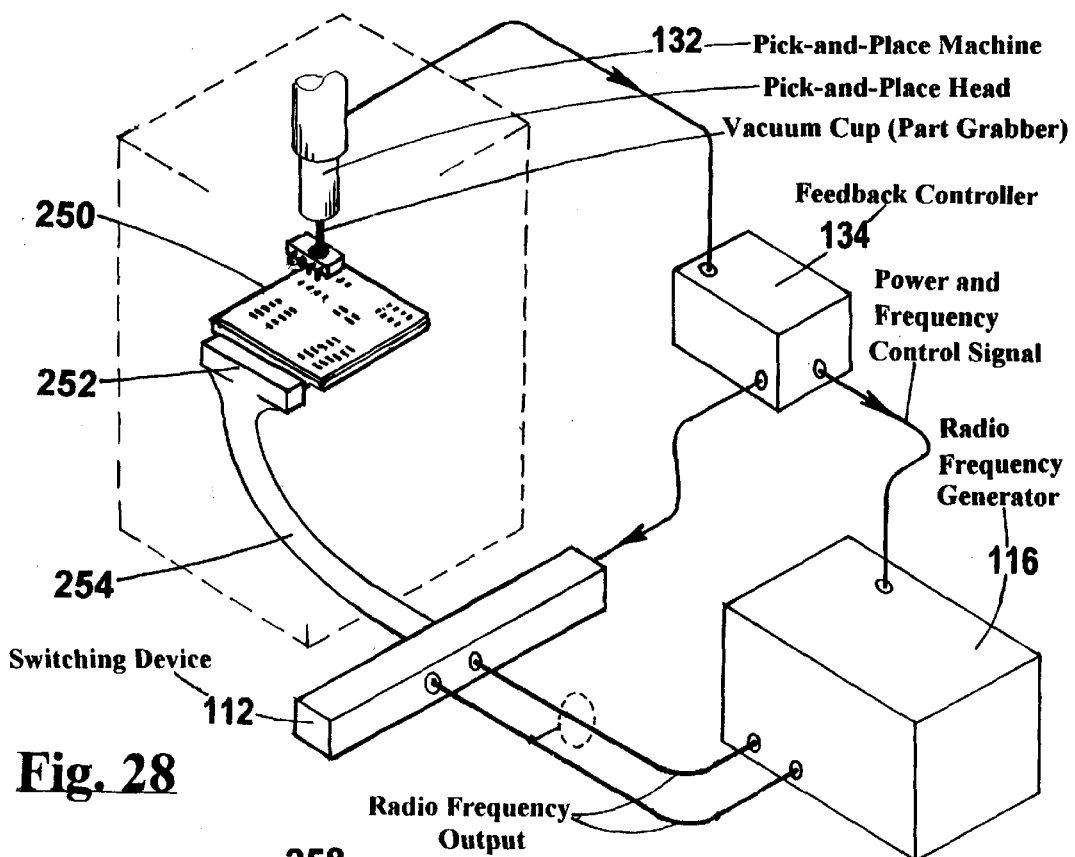
FIG. 28 shows, in perspective view, an embodiment of this invention working in cooperation with a commercially available pick-and-place machine.

Another embodiment of my invention is shown in FIG. 28 illustrated in accordance with the objectives of my invention by comprising a self-soldering PCB 250 that is to be placed on the work holder of a commercially available pick-and-place machine 132, a switching device 112, a feedback controller 134 and a radio-frequency generator 116. PCB 250 contains (embedded) a multiplicity of flat inductors not shown in the figure, each individual flat inductor is capable of being electrically connected to generator 116 by means of device 112. Device 112 comprises a multiplicity of single-pole (preferably solid-state) switches 136 (not shown in this figure) that are capable of connecting each individual flat inductor to said generator 116, independently of other individual flat inductors (comprised into PCB 250) for a different duration of time by the action (or under the command) of said controller 134. Controller 134 receives, and/or extracts, encoded digital signals (or data) normally generated or provided by said pick-and-place machine 132 identifying: (a) the time when a particular component is been acquired or picked up (b) which particular component is been picked-and-placed during each cycle, (c) the placement coordinates on PCB 250, (d) the time when a component is placed down on a PCB 250 and (e) the time when a component is released. This data is used by controller 134 to instruct device 112 when to close and then when to open a particular switch 136. Controller 134 can also instruct generator 116 to: (a) turn itself on and off during pick-and-place cycles, (b) to deliver a predetermined level of alternating current and (c) to deliver a predetermined alternating current frequency. Generator 116 could be capable of supplying an alternating current controllable in intensity and frequency.

Figure 29:
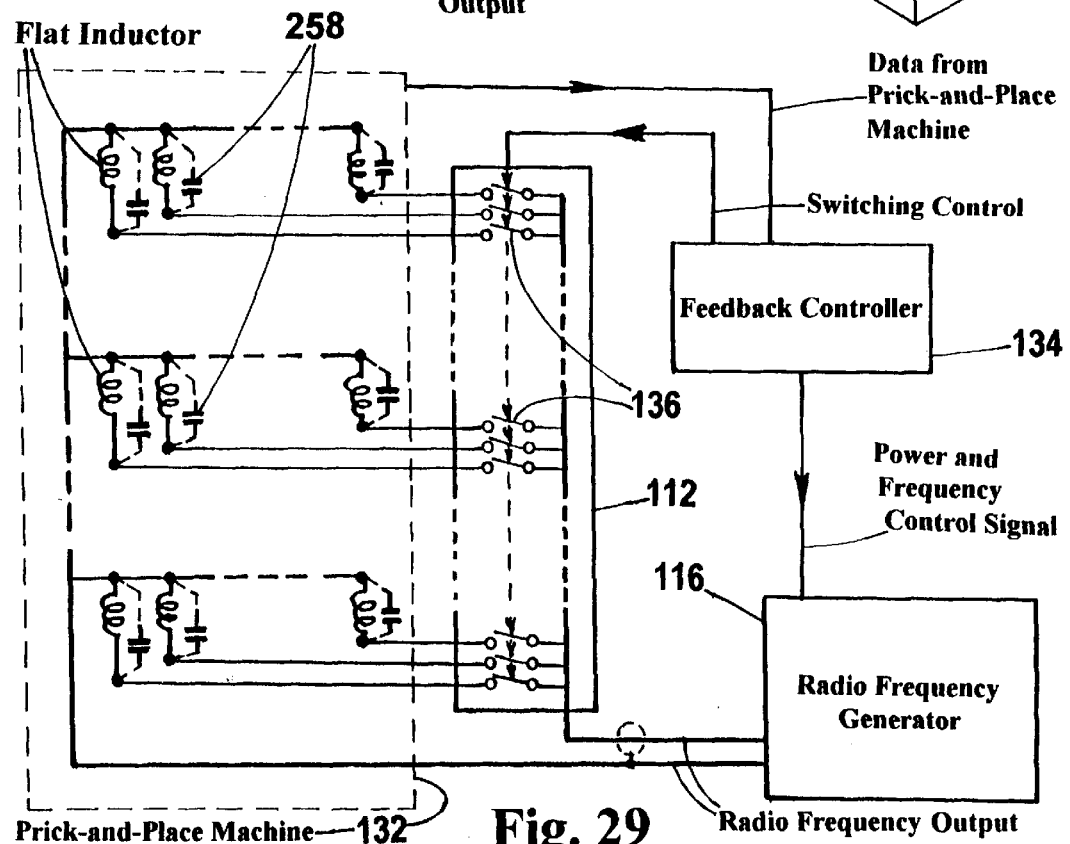
FIG. 29 shows an electric block-diagram corresponding to the embodiment shown in the preceding FIG. 28.

In operation, a self-soldering PCB 250 comprising a multiplicity of pads already covered with adequate amount of solder paste or alternatively with SSDs is held on the top face of the work holder of pick-and-place machine 132. During each pick-and-place cycle that said pick-and-place machine 132 performs, said generator 116 is activated (turned on) and every switch 136 that connects an individual flat inductors positioned under the joints of the particular component been placed during said pick-and-place cycle, is closed for a time duration sufficiently long to achieve melting of solder alloy in the corresponding joints. Both, generator 116 and switches 136 are controlled under command or instruction received from controller 134. The procedure is repeated during every pick-and-place cycle, step by step, until the last component is placed and soldered into said PCB 250. The electric block diagram corresponding to the embodiment illustrated in FIG. 28 is depicted in FIG. 29.

For both above embodiments, it is preferable that generator 116 be a current-regulated type because this mode implies that the magnetomotive force (given in ampere-turns) exerted by a flat inductor is indeed regulated. By controlling the intensity and/or the frequency of said alternating current during a soldering cycle, it is possible to control the rate of solder solidification. Empirical experience demonstrates that more robust joints are obtained by properly controlling said solidification rate.

Radio frequency engineering practice teaches that in order to achieve the most efficient transmission of energy from a radio frequency supply, or generator, into a flat inductor that is part of a self-soldering PCB, it is required that each inductor be part of a circuit that is tuned, or resonating, at the specific frequency supplied. This desirable condition can be met (or approximately met) by adding an adequate capacitor connected in parallel to each flat inductor.

Routinely, this tuning capacitor is supplied as part of any commercial E.I.H. equipment as a bank of switchable capacitors. Switching capacitors is a standard practice that allows to select the appropriate capacitance value for each particular heating application.

As an option in the implementation of this invention, it may be desirable to position said capacitors away from the radio frequency generator and very close to the self-soldering PCB 250. This option should allow for a more precise tuning of every circuit that is part of a flat inductor thus resulting in an optimum matching of impedances between radio frequency generator 116 and flat inductors. Matched impedances results in maximum energy transfer between radio frequency generator 116 and flat inductors.

Figure 30:
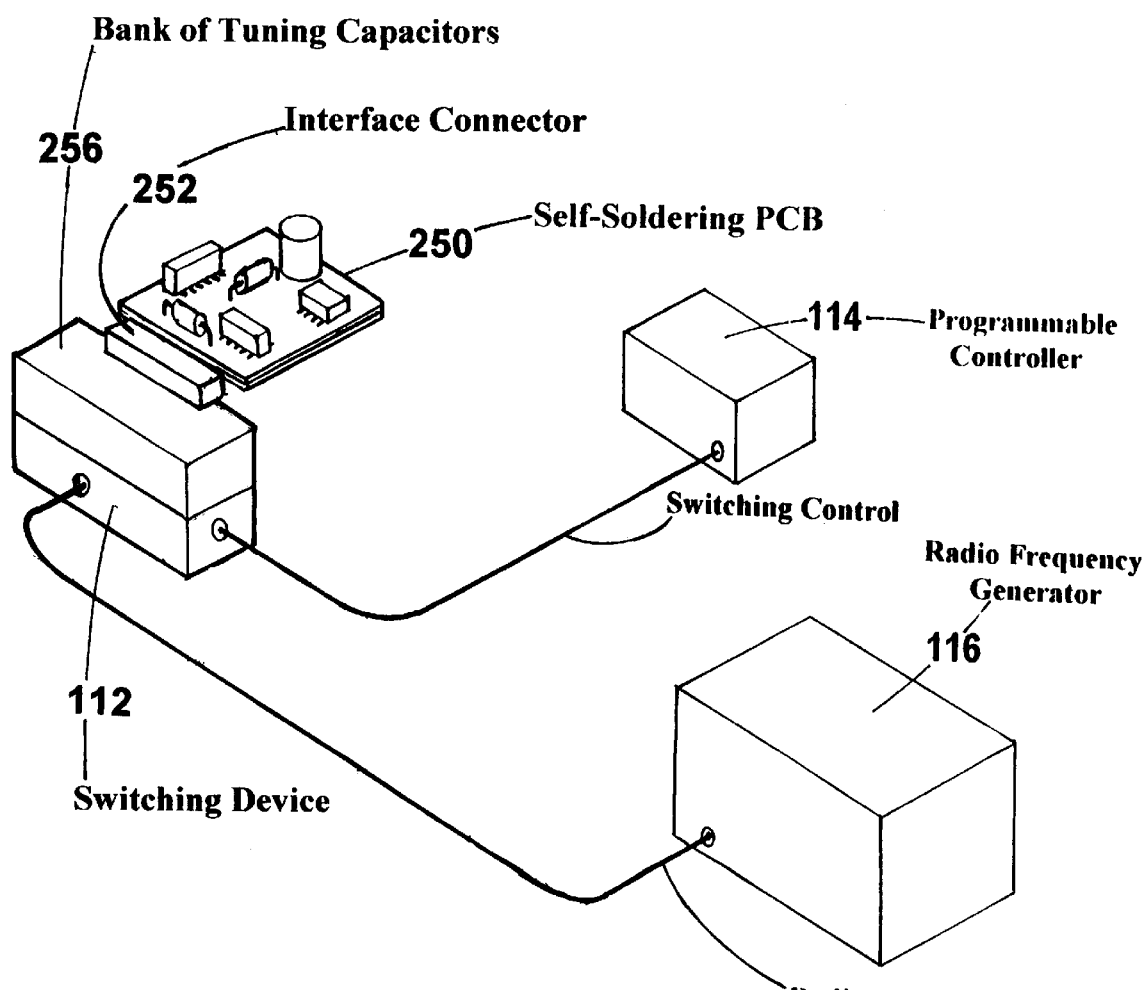
FIG. 30 shows, in perspective view, the same embodiment of FIG. 26 with the corresponding components re-arranged into a more compact package.

FIG. 30 shows, in perspective view, essentially the same embodiment of FIG. 26 with the corresponding components re-arranged into a more compact package. Compactness allows to reduce losses due to parasitic inductance from lengthy interconnections. Notice that harness cable 254 was eliminated. A bank of tuning capacitors 256 is depicted in FIG. 30. Bank 256 comprise a multiplicity of tuning capacitors 258 (not shown in this figure.) Tuning capacitors 258 are shown in FIGS. 27 and 29 connected in parallel by dashed lines, one to each flat inductor. Obviously, the embodiment of FIG. 28 can also be re-arranged to achieve compactness by eliminating harness cable 254. Similarly, a bank of tuning capacitors 256 can be included as part of that embodiment. Bank 256 eliminates the need to switch capacitor during soldering operation.

In order to tune each flat inductor to a desired frequency, the capacitance of each capacitor 256 must be selected accounting for the "effective" inductance of each flat inductor. Notice that in order to calculate, or estimate, the effective inductance of any flat inductor embedded into a self-soldering PCB 250 it is necessary to account for the magnetic coupling, or magnetic load, imposed on the flat inductor by the adjacent leads-and-pads to be soldered. In particular; size, geometry, magnetic permeability and electric resistivity of the joints influence the magnetic coupling and thus the effective inductance (flat inductor plus load combined.)

During a heating cycle the magnetic permeability and/or electric resistivity of the joint(s) being heated may vary, therefore the resonant frequency may not remain constant. Efficient power transmission can be maintained by accordingly varying the supplied frequency or by tuning the circuit to an average frequency.

The compactness approach attained by the embodiment of FIG. 30 facilitates the compliance with regulations of the Federal Communication Commission for Industrial Heating Equipment, as well as specifications of Occupational Safety and Health Standards (OSHA), NEMA and others.

SUMMARY, RAMIFICATIONS, AND SCOPE OF INVENTION

Accordingly, the reader will see that this invention is a truly innovative one that provides the electronic manufacturing or electronics packaging industry with a new, safe, reliable and useful device for inductively soldering electronic components (surface-mount and through-hole types) into a self-soldering PCB. Since during soldering operation my device heats only the leads and pads to be joined by solder, the utilization of my invention offers the following advantages:

permits to inductively solder components to a self-soldering PCB while the main body of the components and the dielectric material of the PCB and its interconnecting traces all remain unheated. Reflow oven or wave soldering equipment is not required.

permits to utilize higher melting temperature solder alloys (such as lead-free types) without damaging the electronic components being soldered.

permits to sequentially mix and solder surface-mount and through-hole components into the same self-soldering PCB.

permits significant process-time reduction by allowing to solder electronic components to a self-soldering PCB up to fifty times faster than conventional wave or reflow processes.

can readily be utilized to complement and/or supplement the reflow and wave soldering processes by providing selective self-soldering of odd-form and/or heat-sensitive components.

reduces manufactured-product cost because much cheaper components rated for exposure to relatively low temperature environment are adequate for use with my invention.

eliminates special packaging and handling of components for moisture control.

eliminates the need to de-moisturize moisture-absorbing components; for example the requirement set by the Joint Electronic Device Engineering Council (JEDEC) to bake plastic BGAs at 125° C. for 24 hours prior to reflow is bypassed.

improves the reliability of manufactured products.

reduces formation of intermetallic layer inside soldered joint thus improving joints robustness.

causes a fast solder-solidification rate resulting in yet more robust soldered joints.

permits in-process, and in-situ, testing of soldered joints quality thus enabling rework before final assembly of self-soldering PCB is completed.

provides for on useful inductive de-soldering device.

can be integrated into a commercially available pick-and-place machine dramatically improving the capability of such machine by performing the task that previously required two different machines. Reflow oven or wave soldering equipment is bypassed.

reduces the energy consumption by about 200 times with respect to the reflow and wave processes.

reduces the required manufacturing floor space.

Although the above description contains many specificities, these should not be construed as limiting the scope of the invention but as merely providing illustrations of some of the presently preferred embodiments of this invention. Many other variations are possible. For example my invention is not limited to PCBs and substrates that are rigid, it is equally applicable to the soldering of components into flexible circuits (by incorporating embedded flat inductors) or the soldering of a flexible circuit into a self-soldering PCB. My invention is also useful for curing conductive adhesives when interconnecting a chip to a self-soldering PCB. Another example is the application of my invention in other processes such as curing of adhesives by utilizing heat induced into a susceptor material embedded into, or contacting to, the substance to be cured.

Accordingly, the scope of my invention should be determined by the appended claims and their legal equivalents, rather than by the embodiments illustrated.

I claim:

1. A self-soldering PCB primarily intended for inductively soldering electronic components on itself, comprising:
   (a) a self-soldering PCB, said self-soldering PCB comprising a multiplicity of soldering pads, a multiplicity of embedded flat inductors arranged under said multiplicity of soldering pads and a plurality of edge contacts electrically connected to said multiplicity of embedded flat inductors, and
   (b) a plurality of electronic components pre-placed on said self-soldering PCB with adequate amount of solder material interposed between their leads and said multiplicity of soldering pads, and
   (c) a radio-frequency generator having its power output directly connected to said multiplicity of embedded flat inductors via said plurality of edge contacts in a predetermined electrical connection, said predetermined electrical connection permits to simultaneously generate localized heating for a predetermined time duration onto said multiplicity of soldering pads and the leads of said plurality of electronic components by turning on-and-off said radio-frequency generator, said localized heating causes said plurality of electronic components to be soldered on said self-soldering PCB whereby in operation, the body of said plurality of electronic components, the dielectric material of said self-soldering PCB and its interconnecting traces all remain relatively cold.

2. A self-soldering PCB primarily intended for inductively soldering electronic components on itself in automated fashion, comprising:
   (a) a self-soldering PCB, said self-soldering PCB comprising a multiplicity of soldering pads, a multiplicity of embedded flat inductors arranged under said multiplicity of soldering pads and a plurality of edge contacts electrically connected to said multiplicity of embedded flat inductors, and
   (b) a plurality of electronic components pre-placed on said self-soldering PCB with adequate amount of solder material interposed between their leads and said multiplicity of soldering pads, and
   (c) a radio-frequency generator having a power output, and
   (d) a switching device that connects and disconnects said power output to said multiplicity of embedded flat inductors via said plurality of edge contacts in a predetermined electrical connection, said predetermined electrical connection permits to simultaneously or sequentially generate localized heating for a predetermined time duration onto all or some of said multiplicity of soldering pads and matching leads of said plurality of electronic components, said localized heating causes said plurality of electronic components to be simultaneously or sequentially soldered on said self-soldering PCB whereby in operation, the body of said plurality of electronic components, the dielectric material of said self-soldering PCB and its interconnecting traces all remain relatively cold.

3. The apparatus of claim 2 further including:
   (e) a programmable controller that drives or instructs said switching device on how to connect and disconnect said power output to said multiplicity of embedded flat inductors in a predetermined electrical connection for a predetermined heating cycle duration specifically pre-selected for each joint being soldered by taking into account the individual thermal-mass of each joint being soldered.

4. A self-soldering PCB primarily intended for inductively soldering electronic components on itself in automated robotic fashion, comprising:
   (a) a pick-and-place machine comprising a work holder, and
   (b) a self-soldering PCB attached to said work holder, said self-soldering PCB comprising a multiplicity of soldering pads having adequate amount of solder material, a multiplicity of embedded flat inductors arranged under said multiplicity of soldering pads and a plurality of edge contacts electrically connected to said multiplicity of embedded flat inductors, and
   (c) a radio-frequency generator having a power output, and
   (d) a switching device capable of sequentially connecting said power output to some of said multiplicity of embedded flat inductors via said plurality of edge contacts in a predetermined electrical connection for a predetermined time duration, and
   (e) a feedback controller that during each subsequent pick-and-place cycle that said pick-and-place machine executes obtains specific data identifying said pick-and-place cycle and uses said data to drive or instruct said switching device to connect and disconnect said power output to some of said multiplicity of embedded flat inductors in a predetermined electrical connection at a predetermined time for a predetermined time duration only causing localized heating into some of said multiplicity of soldering pads that match the electronic component being placed during each pick-and-place cycle therefrom soldering the joints of the electronic component being placed on said self-soldering PCB during each pick-and-place cycle whereby in operation during each subsequent pick-and-place cycle that said pick-and-place machine executes the body of said electronic component being placed, components already soldered and the dielectric material of said self-soldering PCB and its interconnecting traces all remain relatively cold.

5. The apparatus of claim 4 further including:
   (f) a bank of tuning capacitors, said bank of tuning capacitors permits to realize a more efficient transfer of energy from said radio-frequency generator into said multiplicity of embedded flat inductors.

6. The apparatus of claim 5 wherein said feedback controller turns-on and then turns-off said radio-frequency generator during each of said subsequent pick-and-place cycle.

7. The apparatus of claim 6 wherein said feedback controller instructs said radio-frequency generator to deliver a predetermined alternating-current intensity during each of said subsequent pick-and-place cycle.

8. The apparatus of claim 7 wherein said feedback controller instructs said radio-frequency generator to change, or regulate, during each of said subsequent pick-and-place cycle the intensity of said predetermined alternating-current.

9. The apparatus of claim 8 wherein said feedback controller instructs said radio-frequency generator to deliver a predetermined current frequency during each of said subsequent pick-and-place cycle.

10. The apparatus of claim 9 wherein said feedback controller instructs said radio-frequency generator to change, or regulate, during each of said subsequent pick-and-place cycle said predetermined current frequency.

* * * * *